United States Patent
Mahajan et al.

(10) Patent No.: US 12,446,322 B2
(45) Date of Patent: Oct. 14, 2025

(54) ELECTROSTATIC DISCHARGE PROTECTION DEVICES INCLUDING A SILICON-CONTROLLED RECTIFIER

(71) Applicant: GlobalFoundries U.S. Inc., Malta, NY (US)

(72) Inventors: Prantik Mahajan, Dresden (DE); Ajay, Aligarh (IN); Vishal Ganesan, Dresden (DE); Ruchil Jain, Dresden (DE); Souvick Mitra, Essex Junction, VT (US)

(73) Assignee: GlobalFoundries U.S. Inc., Malta, NY (US)

( * ) Notice: Subject to any disclaimer, the term of this patent is extended or adjusted under 35 U.S.C. 154(b) by 569 days.

(21) Appl. No.: 17/724,548

(22) Filed: Apr. 20, 2022

(65) Prior Publication Data

US 2023/0343778 A1  Oct. 26, 2023

(51) Int. Cl.
  *H10D 84/85*  (2025.01)
  *H10D 89/60*  (2025.01)

(52) U.S. Cl.
  CPC ......... *H10D 89/713* (2025.01); *H10D 84/859* (2025.01)

(58) Field of Classification Search
  CPC .................. H01L 27/0262; H10D 89/713
  See application file for complete search history.

(56) References Cited

U.S. PATENT DOCUMENTS

| | | | | |
|---|---|---|---|---|
| 5,905,679 | A  * | 5/1999 | Tsukikawa | H10D 84/859 257/355 |
| 6,212,671 | B1 * | 4/2001 | Kanehira | H10D 84/859 326/103 |
| 8,390,024 | B2 * | 3/2013 | Ren | H01L 27/0259 257/175 |
| 8,952,456 | B2 | 2/2015 | Ker et al. | |
| 9,343,556 | B2 * | 5/2016 | Kuo | H01L 29/66363 |
| 10,475,885 | B2 * | 11/2019 | Deivasigamani | H01L 29/7816 |
| 11,901,353 | B2 * | 2/2024 | Wu | H01L 27/0248 |

(Continued)

OTHER PUBLICATIONS

C. Y. Huang et al., "ESD and Latchup Optimization of an Embedded-Floating-pMOS SCR-Incorporated BJT," in IEEE Transactions on Electron Devices, vol. 63, No. 8, pp. 3036-3043, doi: 10.1109/TED.2016.2582848 (Aug. 2016).

(Continued)

*Primary Examiner* — Ida M Soward
(74) *Attorney, Agent, or Firm* — Thompson Hine LLP; Francois Pagette

(57) ABSTRACT

Structures for an electrostatic discharge device including a silicon-controlled rectifier and methods of forming a structure for an electrostatic discharge device that includes a silicon-controlled rectifier. The structure includes a first well in a semiconductor substrate, a second well and a third well in the first well, and a fourth well in the first well. The first well has a first conductivity type, and the second well and the third well have the first conductivity type. The fourth well positioned in a lateral direction between the second well and the third well, and the fourth well has a second conductivity type opposite to the first conductivity type. The second well, the third well, and the fourth well are positioned in a vertical direction between the first well and a top surface of the semiconductor substrate.

19 Claims, 3 Drawing Sheets

(56) References Cited

U.S. PATENT DOCUMENTS

| | | | | |
|---|---|---|---|---|
| 2003/0047750 A1* | 3/2003 | Russ | ............... | H01L 29/7436 |
| | | | | 257/E29.085 |
| 2008/0128756 A1* | 6/2008 | Satoh | ............... | H10D 84/0191 |
| | | | | 438/130 |
| 2010/0117122 A1* | 5/2010 | Benoit | ............... | H10D 84/0151 |
| | | | | 257/E27.059 |
| 2011/0207409 A1* | 8/2011 | Ker | ............... | H01L 27/0262 |
| | | | | 257/355 |
| 2012/0049259 A1* | 3/2012 | Kim | ............... | H01L 27/0266 |
| | | | | 257/300 |
| 2012/0126285 A1* | 5/2012 | Campi, Jr. | ............... | H01L 27/0928 |
| | | | | 257/E21.388 |
| 2013/0032882 A1* | 2/2013 | Salcedo | ............... | H10D 89/713 |
| | | | | 438/234 |
| 2014/0027815 A1* | 1/2014 | Su | ............... | H01L 29/7436 |
| | | | | 257/E21.608 |
| 2014/0167105 A1* | 6/2014 | Salcedo | ............... | H10D 89/713 |
| | | | | 257/140 |
| 2014/0167106 A1* | 6/2014 | Salcedo | ............... | H10D 89/713 |
| | | | | 257/146 |
| 2016/0204096 A1* | 7/2016 | Zhao | ............... | H03K 17/567 |
| | | | | 327/428 |
| 2016/0300830 A1* | 10/2016 | Salcedo | ............... | H10D 89/10 |
| 2019/0051646 A1* | 2/2019 | Salcedo | ............... | H10D 8/80 |
| 2019/0103498 A1* | 4/2019 | Pang | ............... | H01L 21/76 |
| 2019/0165089 A1* | 5/2019 | Chen | ............... | H01L 29/0615 |
| 2021/0082906 A1* | 3/2021 | Peng | ............... | H01L 27/0262 |
| 2022/0199611 A1* | 6/2022 | Chen | ............... | H10D 84/0109 |

OTHER PUBLICATIONS

Mahajan, Prantik et al., "A Device for Electrostatic Discharge Protection" filed on Sep. 10, 2021 as a U.S. Appl. No. 17/471,190.

* cited by examiner

ELECTROSTATIC DISCHARGE PROTECTION DEVICES INCLUDING A SILICON-CONTROLLED RECTIFIER

BACKGROUND

The disclosure relates generally to semiconductor devices and integrated circuit fabrication and, more specifically, to structures for an electrostatic discharge device including a silicon-controlled rectifier and methods of forming a structure for an electrostatic discharge device that includes a silicon-controlled rectifier.

An integrated circuit may be exposed to random electrostatic discharge (ESD) events that can direct potentially large and damaging ESD currents to the sensitive devices of the integrated circuit. An ESD event refers to an unpredictable electrical discharge of a positive or negative current over a short duration and during which a large amount of current is directed to the integrated circuit. An ESD event may occur during post-manufacture chip handling or after chip installation on a circuit board or other carrier. The high current may originate from a variety of sources, such as the human body, a machine component, or a chip carrier.

Precautions may be taken to protect the integrated circuit from an ESD event. One such precaution is to incorporate an on-chip protection circuit that is designed to avert damage to the sensitive devices of the integrated circuit during an ESD event. If an ESD event occurs, a protection device of the protection circuit is triggered to enter a low-impedance state that conducts the ESD current to ground and shunts the ESD current away from the integrated circuit. The protection device remains clamped in its low-impedance state until the ESD current is drained and the ESD voltage is discharged to an acceptable level.

A common type of protection device commonly deployed in an ESD protection circuit is a silicon-controlled rectifier (SCR). In its quiescent state, the SCR restricts current conduction to leakage current. However, a voltage pulse exceeded an engineered threshold, known as the trigger voltage, initiates the conduction of a forward current between the anode and cathode of the SCR. Even after the trigger voltage is removed, the SCR remains clamped to conduct the forward current so long as the forward current remains above an engineered holding current. When the forward current from the ESD event drops below the holding current, the SCR returns to its quiescent state.

Improved structures for an electrostatic discharge device including a silicon-controlled rectifier and methods of forming a structure for an electrostatic discharge device that includes a silicon-controlled rectifier are needed.

SUMMARY

In an embodiment, a structure for an electrostatic discharge device is provided. The structure comprises a semiconductor substrate having a top surface, a first well in the semiconductor substrate, a second well and a third well in the first well, and a fourth well in the first well. The first well has a first conductivity type, and the second well and the third well have the first conductivity type. The fourth well positioned in a lateral direction between the second well and the third well, and the fourth well has a second conductivity type opposite to the first conductivity type. The second well, the third well, and the fourth well are positioned in a vertical direction between the first well and the top surface of the semiconductor substrate.

In an embodiment, a method of forming a structure for an electrostatic discharge device is provided. The method comprises forming a first well in a semiconductor substrate, forming a second well and a third well in the first well, and forming a fourth well in the first well. The first well has a first conductivity type, the second well and the third well have the first conductivity type, and the fourth well is positioned in a lateral direction between the second well and the third well. The fourth well has a second conductivity type opposite to the first conductivity type, and the second well, the third well, and the fourth well are positioned in a vertical direction between the first well and a top surface of the semiconductor substrate.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals are used to indicate like features in the various views.

DETAILED DESCRIPTION

Figure 1:
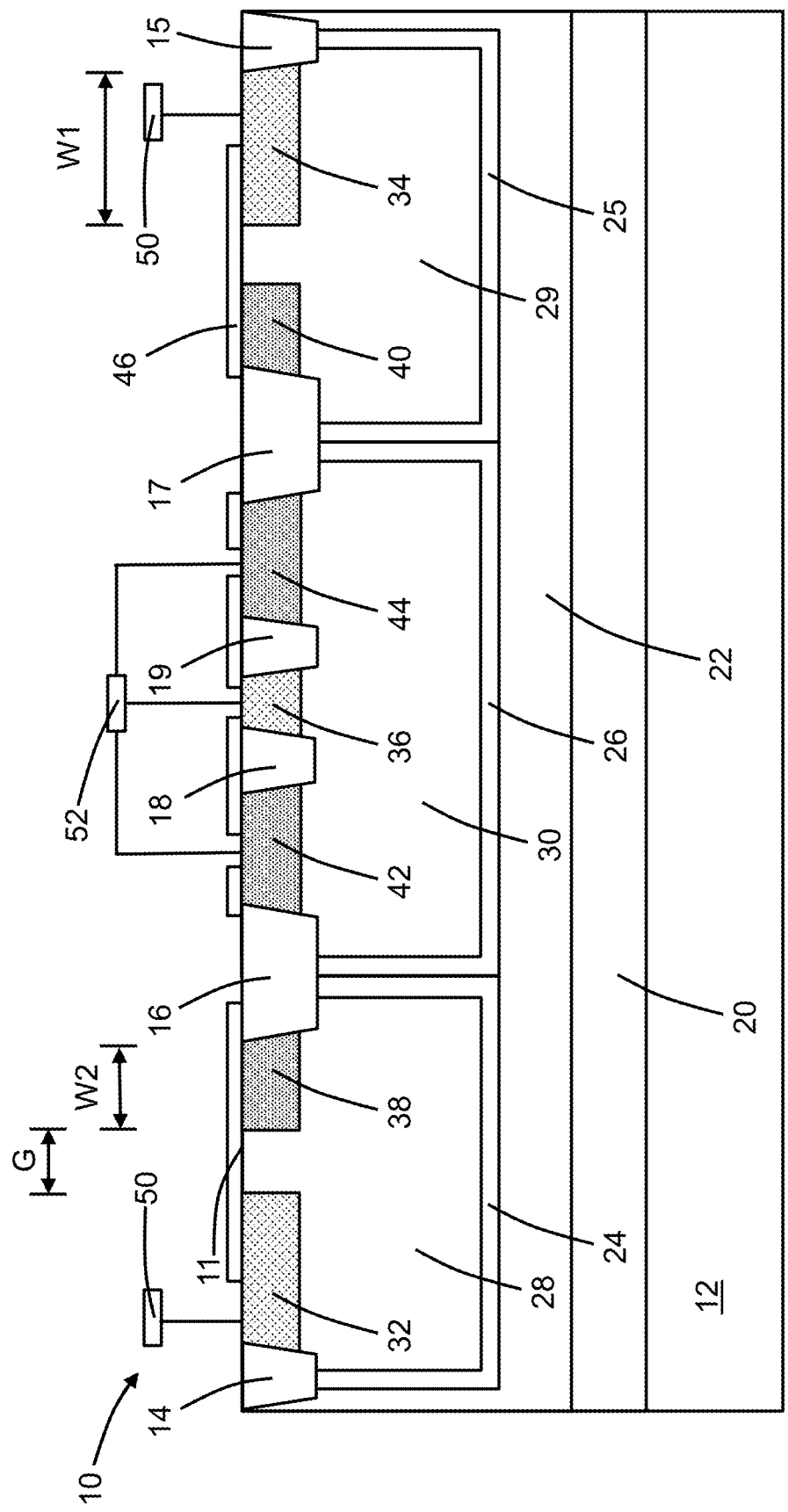
FIG. 1 is a cross-sectional view of a structure in accordance with embodiments of the invention.

With reference to FIG. 1 and in accordance with embodiments of the invention, a structure 10 for an electrostatic discharge protection device includes a semiconductor substrate 12, as well as shallow trench isolation regions 14, 15, shallow trench isolation regions 16, 17, and shallow trench isolation regions 18, 19 that are arranged in the semiconductor substrate 12. The semiconductor substrate 12 may be comprised of a semiconductor material, such as single-crystal silicon. In an embodiment, the semiconductor substrate 12 may be lightly doped to have p-type conductivity.

The shallow trench isolation regions 14, 15, 16, 17, 18, 19 may be formed by patterning shallow trenches in the semiconductor substrate 12 with lithography and etching processes, depositing a dielectric material, such as silicon dioxide, to fill the shallow trenches, and planarizing and/or recessing the deposited dielectric material. The shallow trench isolation region 14 is positioned adjacent to the shallow trench isolation region 16, the shallow trench isolation region 15 is positioned adjacent to the shallow trench isolation region 17, and the shallow trench isolation regions 18, 19 are positioned adjacent to each other.

A deep well 20 is formed over a depth range beneath a front or top surface 11 of the semiconductor substrate 12. The deep well 20 may be formed in the semiconductor substrate 12 by introducing a dopant by, for example, ion implantation with given implantation conditions. The deep well 20 is doped to have an opposite conductivity type from the underlying portion of the semiconductor substrate 12. In an embodiment, the deep well 20 may be doped with a concentration of an n-type dopant (e.g., arsenic or phosphorus) to provide n-type conductivity. The deep well 20 may provide a buried isolation well in the completed structure 10.

A deep well 22 is formed over a depth range beneath the top surface 11 of the semiconductor substrate 12. The deep well 22 is positioned in a vertical direction between the deep well 20 and the top surface 11 of the semiconductor substrate 12. The deep well 22 may be formed in the semiconductor substrate 12 by introducing a dopant by, for example, ion implantation with given implantation conditions. The implantation conditions (e.g., ion species, dose, kinetic energy) may be selected to tune the electrical and physical characteristics of the deep well 22. The deep well 22 may be doped to have an opposite conductivity type from the deep well 20. In an embodiment, the deep well 22 may be doped with a concentration of a p-type dopant (e.g., boron) to provide p-type conductivity. The deep well 22, which adjoins the deep well 20, may provide a high-voltage well in the completed structure 10.

Drift wells 24, 25, 26 are formed within the deep well 22. The drift wells 24, 25 may be doped to have the same conductivity type as the deep well 22 but at a higher dopant concentration than the deep well 22, and the drift well 26 may be doped to have an opposite conductivity type from the deep well 22. The drift well 26 is positioned adjacent to each of the drift wells 24, 25, and the drift well 26 is positioned in a lateral direction between the drift well 24 and the drift well 25. In an embodiment, the drift well 26 may adjoin each of the drift wells 24, 25 along an interface across which the conductivity type changes. The drift wells 24, 25, 26, which may adjoin the deep well 22, are positioned in a vertical direction between the deep well 22 and the top surface 11 of the semiconductor substrate 12.

The drift wells 24, 25 may be formed in the semiconductor substrate 12 by introducing a dopant by, for example, ion implantation with given implantation conditions. A patterned implantation mask may be formed to define selected areas on the top surface 11 of the semiconductor substrate 12 that are exposed for implantation. The implantation mask may include a layer of an organic photoresist that is applied and patterned to form openings exposing the selected areas on the top surface 11 of the semiconductor substrate 12 and determining, at least in part, the location and horizontal dimensions of the drift wells 24, 25. The implantation mask has a thickness and stopping power sufficient to block implantation in masked areas. Implantation conditions (e.g., ion species, dose, kinetic energy) may be selected to tune the electrical and physical characteristics of the drift wells 24, 25. In an embodiment, the drift wells 24, 25 may be doped with a concentration of a p-type dopant (e.g., boron) to provide p-type conductivity.

The drift well 26 may be formed in the semiconductor substrate 12 by introducing a dopant by, for example, ion implantation with given implantation conditions. A patterned implantation mask may be formed to define a selected area on the top surface 11 of the semiconductor substrate 12 that is exposed for implantation. The implantation mask may include a layer of an organic photoresist that is applied and patterned to form an opening exposing the selected area on the top surface 11 of the semiconductor substrate 12 and determining, at least in part, the location and horizontal dimensions of the drift well 26. The implantation mask has a thickness and stopping power sufficient to block implantation in masked areas. The implantation conditions (e.g., ion species, dose, kinetic energy) may be selected to tune the electrical and physical characteristics of the drift well 26. In an embodiment, the drift well 26 may be doped with a concentration of an n-type dopant (e.g., arsenic or phosphorus) to provide n-type conductivity.

Body wells 28, 29 are formed that are respectively embedded within the drift wells 24, 25. The body wells 28, 29 are doped to have the same conductivity type as the drift wells 24, 25 but at a higher dopant concentration than the drift wells 24, 25. The body wells 28, 29 may be formed in the semiconductor substrate 12 by introducing a dopant of a given conductivity type by, for example, ion implantation with given implantation conditions. A patterned implantation mask may be formed to define selected areas on the top surface 11 of the semiconductor substrate 12 that are exposed for implantation. The implantation mask may include a layer of an organic photoresist that is applied and patterned to form openings exposing the selected areas on the top surface 11 of the semiconductor substrate 12 and determining, at least in part, the location and horizontal dimensions of the body wells 28, 29. The implantation mask has a thickness and stopping power sufficient to block implantation in masked areas. The implantation conditions (e.g., ion species, dose, kinetic energy) may be selected to tune the electrical and physical characteristics of the body wells 28, 29. In an embodiment, the body wells 28, 29 may be doped with a concentration of a p-type dopant (e.g., boron) to provide p-type conductivity.

The body well 28 extends laterally from the shallow trench isolation region 14 to the shallow trench isolation region 16, and the body well 29 extends laterally from the shallow trench isolation region 15 to the shallow trench isolation region 17. The body wells 28, 29 are positioned in a vertical direction between the deep well 22 and the top surface 11 of the semiconductor substrate 12. The body well 28 is surrounded by the drift well 24, and the body well 29 is surrounded by the drift well 25. The body wells 28, 29 and the deep well 22 have an overlapping relationship.

A body well 30 is formed that is embedded within the drift well 26. The body well 30 is doped to have the same conductivity type as the drift well 26 but at a higher dopant concentration. The body well 30 may be formed in the semiconductor substrate 12 by introducing a dopant of a given conductivity type by, for example, ion implantation with given implantation conditions. A patterned implantation mask may be formed to define a selected area on the top surface 11 of the semiconductor substrate 12 that is exposed for implantation. The implantation mask may include a layer of an organic photoresist that is applied and patterned to form an opening exposing the selected area on the top surface 11 of the semiconductor substrate 12 and determining, at least in part, the location and horizontal dimensions of the body well 30. The implantation mask has a thickness and stopping power sufficient to block implantation in masked areas. The implantation conditions (e.g., ion species, dose, kinetic energy) may be selected to tune the electrical and physical characteristics of the body well 30. In an embodiment, the body well 30 may be doped with a concentration of an n-type dopant (e.g., arsenic or phosphorus) to provide n-type conductivity.

The body well 30 is positioned in a lateral direction between the body well 28 and the body well 29. In an embodiment, the body well 30 may be centrally positioned in a lateral direction between the body well 28 and the body well 29 to provide a symmetrical arrangement. The body well 30 extends laterally from the shallow trench isolation region 16 to the shallow trench isolation region 17, and the shallow trench isolation regions 18, 19 are positioned in the body well 30. The body well 30 is positioned in a vertical direction between the deep well 22 and the top surface 11 of the semiconductor substrate 12. The body well 30 is surrounded by the drift well 26. The body well 30 and the deep well 22 have an overlapping relationship.

Doped regions 32, 34 are formed in the body wells 28, 29 adjacent to the top surface 11 of the semiconductor substrate 12, and a doped region 36 is formed in the body well 30 adjacent to the top surface 11 of the semiconductor substrate 12. The doped regions 32, 34 may be doped to have an opposite conductivity type from the body wells 28, 29, and the doped region 36 may be doped to have the same conductivity type as the body well 30 but at a higher dopant concentration. In an embodiment, the doped regions 32, 34, 36 may be doped (e.g., heavily doped) with a concentration of an n-type dopant (e.g., arsenic or phosphorus) to provide n-type conductivity. The doped region 36 is positioned in a lateral direction between the shallow trench isolation region 18 and the shallow trench isolation region 19 near the center of the device structure. The doped region 32 is positioned in a lateral direction adjacent to the shallow trench isolation region 14 and spaced from the shallow trench isolation region 16. The doped region 34 is positioned in a lateral direction adjacent to the shallow trench isolation region 15 and spaced apart from the shallow trench isolation region 17. The doped regions 32, 34, 36 may be concurrently formed by selectively implanting ions, such as ions including the n-type dopant, under given implantation conditions with an implantation mask having openings defining the intended locations for the doped regions 32, 34, 36 in the semiconductor substrate 12.

Doped regions 38, 40 are formed in the body wells 28, 29 adjacent to the top surface 11 of the semiconductor substrate 12, and doped regions 42, 44 are formed in the body well 30 adjacent to the top surface 11 of the semiconductor substrate 12. The doped regions 38, 40 may be doped to have the same conductivity type as the body wells 28, 29 but at a higher dopant concentration, and the doped regions 42, 44 may be doped to have an opposite conductivity type from the body well 30. In an embodiment, the doped regions 38, 40, 42, 44 may be doped (e.g., heavily doped) with a concentration of a p-type dopant (e.g., boron) to provide p-type conductivity. The doped regions 38, 40, 42, 44 may be concurrently formed by selectively implanting ions, such as ions including the p-type dopant, under given implantation conditions with an implantation mask having openings defining the intended locations for the doped regions 38, 40, 42, 44 in the semiconductor substrate 12.

The doped region 38 is positioned adjacent to the shallow trench isolation region 16 and is laterally spaced from the shallow trench isolation region 14. The doped region 38 and the doped region 32 are both positioned in a lateral direction between the shallow trench isolation region 14 and the shallow trench isolation region 16, but are spaced apart from each other. The doped region 32 may adjoin the shallow trench isolation region 14, and the doped region 38 may adjoin the shallow trench isolation region 16.

The doped region 40 is positioned adjacent to the shallow trench isolation region 17 and is laterally spaced from the shallow trench isolation region 15. The doped region 34 and the doped region 40 are both positioned in a lateral direction between the shallow trench isolation region 15 and the shallow trench isolation region 17, but are spaced apart from each other. The doped region 34 may adjoin the shallow trench isolation region 15, and the doped region 40 may adjoin the shallow trench isolation region 17.

The doped region 32 and the doped region 34 have a width W1, the doped region 38 and the doped region 40 have a width W2, the doped region 38 is laterally spaced from the doped region 32 by a gap G, and the doped region 40 is laterally spaced from the doped region 34 also by the gap G. The value of the width W1, the value of the W2, and the value of the gap G may be adjusted as dimensions used to adjust and tune the holding voltage. Respective portions of the body wells 28, 29 are positioned in the gaps G. In an alternative embodiment, the gap G between the doped region 32 and the doped region 38 may differ from the gap G between the doped region 34 and the doped region 40.

A dielectric layer 46 is formed that defines sections of a salicide-blocking layer. The dielectric layer 46 may be comprised of, for example, silicon nitride that is deposited on the top surface 11 of the semiconductor substrate 12 and then patterned by lithography and etching processes. The doped region 38 and the adjacent portion of the well 28 in the gap G are fully covered at the top surface 11 of the semiconductor substrate 12 by a section of the dielectric layer 46. Similarly, the doped region 40 and the adjacent portion of the well 29 in the gap G are fully covered at the top surface 11 of the semiconductor substrate 12 by another section of the dielectric layer 46. In an embodiment, a section of the dielectric layer 46 is positioned on the top surface 11 over a portion of the shallow trench isolation region 16, the doped region 38, the portion of the body well 28 in the gap G, and a portion of the doped region 32, and another section of the dielectric layer 46 is positioned on the top surface 11 of the semiconductor substrate 12 over a portion of the shallow trench isolation region 17, the doped region 40, the portion of the body well 29 in the gap G, and a portion of the doped region 34.

Middle-of-line processing and back-end-of-line processing follow, which includes formation of an interconnect structure coupled with the structure 10. In particular, a silicide layer may be formed in a self-aligned manner on portions of the top surface 11 not covered by the sections of the dielectric layer 46 to facilitate an electrical connection to the doped regions 32, 34 and a separate electrical connection to the doped regions 36, 42, 44. The sections of the dielectric layer 46 block the formation of silicide on the top surface 11 over the doped regions 38, 40, which are electrically floating in the completed structure 10.

The structure 10 may embody a symmetrical unidirectional structure for the electrostatic discharge protection device that may be suitable for use in high-voltage applications. The doped regions 32, 34 may provide a cathode 50 of the structure 10, and the doped regions 36, 42, 44 may provide an anode 52 of the structure 10. The structure 10 includes a fully-isolated, series-connected parasitic vertical silicon-controlled rectifier coupled to the anode 52 and a parasitic vertical bipolar junction transistor coupled to the cathode 50. The parasitic vertical silicon-controlled rectifier includes the doped regions 42, 44, the body well 30, the drift well 26, the deep well 22, and the deep well 20, which define a PNPN layered stack in a vertical direction. The parasitic vertical bipolar junction transistor includes the doped regions 32, 34, the body wells 28, 29, the drift wells 24, 25, the deep well 22, and the deep well 20, which define an NPN layered stack in a vertical direction. The deep well 20 couples the parasitic vertical silicon-controlled rectifier to the parasitic vertical bipolar junction transistor in the structure 10.

The drift wells 24, 25 contribute to graded junctions defined between the body wells 28, 29 and the deep well 22, which may be effective to increase the breakdown voltage of the structure 10. The sections of the dielectric layer 46 and/or the shallow trench isolation regions 14, 15, 16, 17, 18, 19 may be strategically placed to increase the failure current of the structure 10. The dual connections to the cathode 50 provide a pair of conduction paths that may more effectively dissipate current from an electrostatic discharge event in a high-voltage application, such as an application in which the structure 10 is coupled to a high-voltage power pad.

The structure 10 includes the doped regions 38, 40 that are positioned inside the body well 28, 29, that are floating, and that are separated from the doped regions 32, 34 of the cathode by respective gaps G. The doped regions 38, 40 may be effective to weaken, or to prevent, lateral silicon-controlled rectifier action in the structure 10 during operation and assist with increasing the holding voltage of the parasitic vertical silicon-controlled rectifier.

Figure 2:
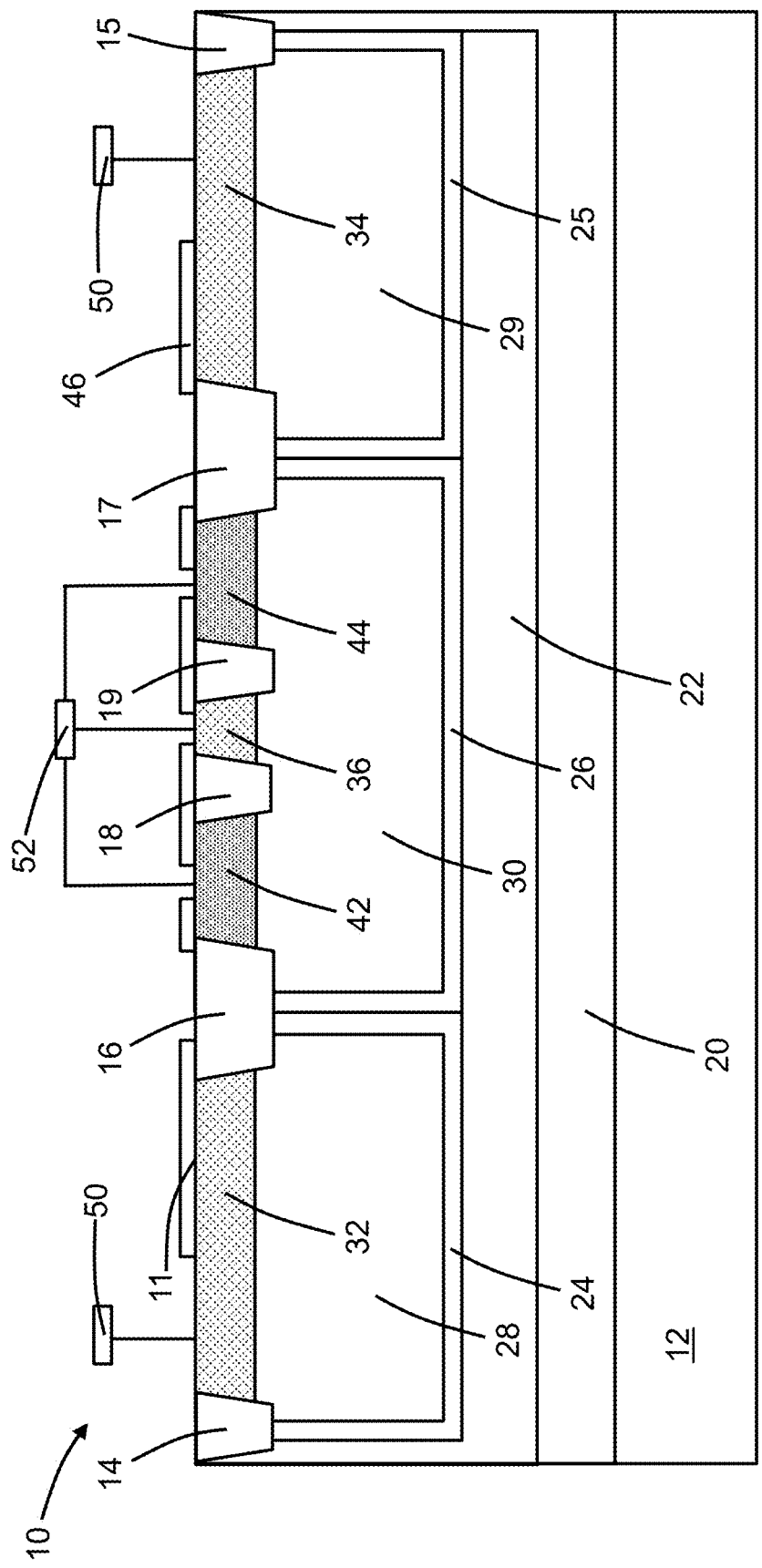
FIG. 2 is a cross-sectional view of a structure in accordance with alternative embodiments of the invention.

With reference to FIG. 2 in which like reference numerals refer to like features in FIG. 1 and in accordance with alternative embodiments of the invention, the doped regions 38, 40 may be omitted from the structure 10. The width of the doped region 32 may be increased such that the doped region 32 extends laterally from the shallow trench isolation region 14 to the shallow trench isolation region 16 and adjoins each of the shallow trench isolation regions 14, 16. Similarly, the width of the doped region 34 may be increased such that the doped region 34 extends laterally from the shallow trench isolation region 15 to the shallow trench isolation region 17 and adjoins each of the shallow trench isolation regions 15, 17.

Figure 3:
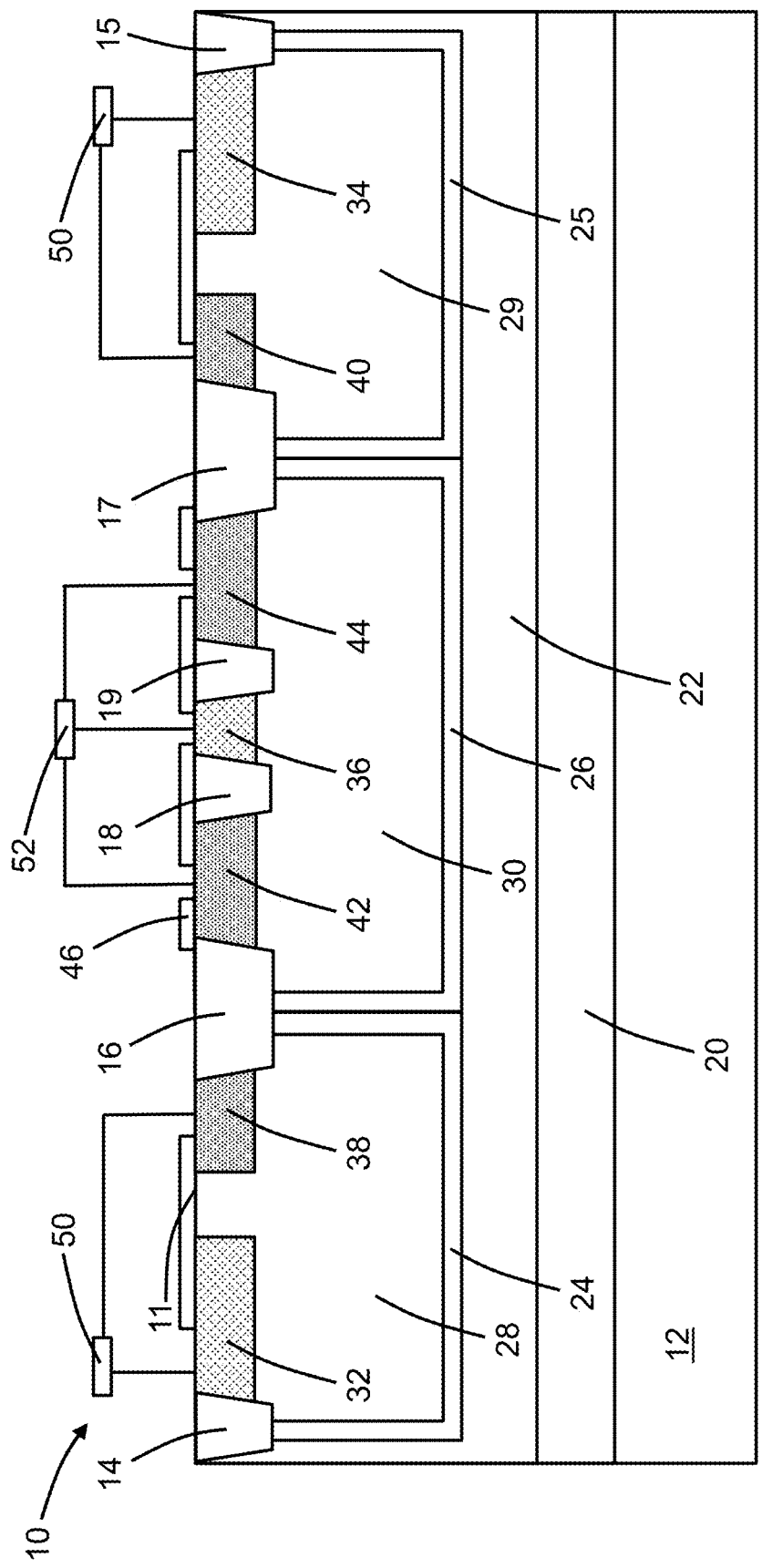
FIG. 3 is a cross-sectional view of a structure in accordance with alternative embodiments of the invention.

With reference to FIG. 3 in which like reference numerals refer to like features in FIG. 1 and in accordance with alternative embodiments of the invention, the dielectric layer 46 may be modified such that the doped regions 38, 40 are not fully covered at the top surface 11 of the semiconductor substrate 12 by sections of the dielectric layer 46. The doped regions 38, 40 are not constrained to be electrically floating. Instead, the doped regions 38, 40 may be coupled by electrical connections in the interconnect structure to the cathode 50. In an embodiment, the structure 10 modified by the electrical connections of the doped regions 38, 40 to the cathode 50 provide a lateral PNP embedded in the device structure 10.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate a range of +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features may "overlap" if a feature extends over, and covers a part of, another feature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for an electrostatic discharge protection device, the structure comprising:
    a semiconductor substrate having a top surface;
    a first shallow trench isolation region in the semiconductor substrate;
    a second shallow trench isolation region in the semiconductor substrate, the second shallow trench isolation region adjacent to the first shallow trench isolation region;
    a third shallow trench isolation region in the semiconductor substrate, the third shallow trench isolation region adjacent to the second shallow trench isolation region;
    a first well in the semiconductor substrate, the first well having a first conductivity type;
    a second well and a third well in the first well, the second well and the third well having the first conductivity type;
    a fourth well in the first well, the fourth well positioned in a lateral direction between the second well and the third well, and the fourth well having a second conductivity type opposite to the first conductivity type;
    a first doped region in the second well, the first doped region having the first conductivity type, and the first doped region having a higher dopant concentration than the second well;
    a second doped region in the second well, the second doped region having the second conductivity type, and the second doped region spaced in the lateral direction from the first doped region by a gap;
    a third doped region in the fourth well, the third doped region having the second conductivity type;
    a fourth doped region in the fourth well, the fourth doped region having the first conductivity type; and
    a first electrical connection coupled to the third doped region and the fourth doped region,
    wherein the first doped region and the second doped region are positioned in the lateral direction between the first shallow trench isolation region and the second shallow trench isolation region, the second well, the third well, and the fourth well are positioned in a vertical direction between the first well and the top surface of the semiconductor substrate, the second shallow trench isolation region is positioned in the lateral direction between the first doped region and the third doped region, and the third shallow trench isolation region is positioned in the lateral direction between the third doped region and the fourth doped region.

2. The structure of claim 1 wherein the first conductivity type is p-type, and the second conductivity type is n-type.

3. The structure of claim 1 wherein the first doped region is positioned adjacent to the first shallow trench isolation region, and a portion of the second well is located in the gap.

4. The structure of claim 3 further comprising:
a dielectric layer positioned on the top surface of the semiconductor substrate over the first doped region and the portion of the second well in the gap.

5. The structure of claim 1 wherein the second well is positioned in the vertical direction between the first doped region and the first well.

6. The structure of claim 1 wherein the fourth well is positioned in the vertical direction between the third doped region and the first well.

7. The structure of claim 1 further comprising:
a fifth well in the semiconductor substrate, the fifth well having the second conductivity type,
wherein the first well is positioned in the vertical direction between the fifth well and the second well, the first well is positioned in the vertical direction between the fifth well and the third well, and the first well is positioned in the vertical direction between the fifth well and the fourth well.

8. The structure of claim 7 wherein the fifth well adjoins the first well.

9. The structure of claim 1 wherein the second well, the third well, and the fourth well overlap with the first well.

10. The structure of claim 1 wherein the first doped region is electrically floating.

11. The structure of claim 10 further comprising:
a second electrical connection coupled to the first doped region.

12. The structure of claim 11 wherein the first doped region is positioned adjacent to the first shallow trench isolation region, and a portion of the second well is located in the gap.

13. The structure of claim 12 further comprising:
a dielectric layer positioned on the top surface of the semiconductor substrate over the first doped region and the portion of the second well in the gap.

14. The structure of claim 13 wherein the first conductivity type is p-type, and the second conductivity type is n-type.

15. The structure of claim 1 further comprising:
a dielectric layer positioned on the top surface of the semiconductor substrate over the first doped region and the gap.

16. The structure of claim 1 further comprising:
a second electrical connection coupled to the first doped region.

17. The structure of claim 16 wherein the first doped region is positioned adjacent to the first shallow trench isolation region, and a portion of the second well is located in the gap.

18. The structure of claim 17 further comprising:
a dielectric layer positioned on the top surface of the semiconductor substrate over the first doped region and the portion of the second well in the gap.

19. The structure of claim 18 wherein the first conductivity type is p-type, and the second conductivity type is n-type.

* * * * *